United States Patent
Aue

(10) Patent No.: US 6,549,149 B2
(45) Date of Patent: Apr. 15, 2003

(54) METHOD AND DEVICE FOR DETECTING SIGNALS

(75) Inventor: Axel Aue, Korntal-Muenchingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/975,024

(22) Filed: Oct. 10, 2001

(65) Prior Publication Data

US 2002/0084926 A1 Jul. 4, 2002

(30) Foreign Application Priority Data

Oct. 13, 2000 (DE) .......................... 100 50 962

(51) Int. Cl.$^7$ ................................ H03M 1/06
(52) U.S. Cl. ......................... 341/118; 341/110
(58) Field of Search ................ 341/118, 110, 341/120

(56) References Cited

U.S. PATENT DOCUMENTS

RE34,899 E * 4/1995 Gessaman et al. .......... 320/166
5,673,047 A * 9/1997 Moreland ................... 341/139

FOREIGN PATENT DOCUMENTS

DE      37 00 987     7/1988     ............. G06F/3/05

OTHER PUBLICATIONS

Klaus Dembowski, *PC–Gesteuerte Meßtechnik* [*PC–Controlled Measurement Technology*], Markt–und Technik–Verlag, 1993 (ISBN 3–87791–516–7), pp. 169–206.*

* cited by examiner

Primary Examiner—Peguy Jeanpierre
(74) Attorney, Agent, or Firm—Kenyon & Kenyon

(57) ABSTRACT

A method and a device for detecting at least one first signal for a computer is described, having a converter device which converts the first signal to a second signal, and including a reference device to which a first reference signal is applied and which converts it to a second reference signal. Also included is a first switching element which can switch the second reference signal to the converter device, the converter device converting the second reference signal to a third reference signal. The method and device described herein also include a matching arrangement, which also receives the second reference signal and matches the second reference signal to a fourth reference signal, and at least a second switching element which can switch the fourth reference signal to the converter device, which then converts it to a fifth reference signal. Also included is a comparator element with the help of which a correcting quantity is formed from the third and fifth reference signals, the first signal being detected as a function of the correcting quantity.

17 Claims, 3 Drawing Sheets

METHOD AND DEVICE FOR DETECTING SIGNALS

FIELD OF THE INVENTION

The present invention relates to a method and a device for detecting at least one signal for a computer, the signal being converted by a converter device.

BACKGROUND INFORMATION

Many different converter devices are known from the related art, in particular analog-to-digital converters and digital-to-analog converters. Such converter devices or signal converters are used in the related art for converting physical quantities to a voltage, for example.

Corresponding converter modules are known from the technical book "PC-gesteuerte Meßtechnik" (PC-Controlled Measurement Technology) by Klaus Dembowski from Marktund Technik-Verlag in 1993 (ISBN 3-87791-516-7), pages 169 through 206, where it is pointed out that in many cases, a converter module requires an additional periphery of analog and digital components to make it possible to work accordingly. For example, a multiplexer is required for detecting signals in multiple channels.

German Published Patent Application No. 37 00 987 describes a device for detecting an electric voltage signal for processing in a microcomputer in which at least one analog-to-digital converter is provided with a word of n bits, and in which it is possible to display the voltage to be measured by an additional digital-to-analog converter and an external circuit with the same accuracy of n bits, but with a higher monotonic resolution over the entire measurement range. The complete monotony of the more highly resolved measurement result is then achieved by software routines in the microcomputer on the basis of simple limit value comparisons.

The accuracy of such converter devices depends first on the signal level, in particular the voltage, for which the converter device or the computer containing it is intended, and secondly, it depends on the resolution of the converter device.

In general, it is known that signal matching can be performed with the help of a matching arrangement, e.g., a voltage divider.

Thus, if the level of the signal to be detected is different from the intended signal level at the input of the converter device, signal matching could be performed by a matching arrangement, but inaccuracies in the matching arrangement would be reflected directly in the conversion result. Thus, if the signal level of the signal to be measured or converted is different from, in particular higher than, the maximum signal level intended for the converter device, in particular the A/D converter, then it could be converted by a matching arrangement, in particular a voltage divider, only with a lower accuracy. Influencing quantities here include, for example, the temperature, inaccuracies in the matching arrangement, in particular in the resistors of a voltage divider, and aging phenomena, in particular in the resistors of the voltage divider. This loss of accuracy is manifested in a very interfering manner in particular since the inaccuracies in the converter device itself, e.g., due to nonlinearities or offset, usually turn out to be lower by a power of 10 than the inaccuracies in the matching arrangement, in particular the voltage divider.

SUMMARY OF THE INVENTION

An object of the present invention is thus to compensate for the loss of accuracy when using a matching arrangement which matches the input signals or the input signal level to the intended signals of the converter device or the computer containing the converter device and thus to compensate, i.e. to achieve an increase in accuracy. An improvement in the properties of a converter device, in particular an analog-to-digital converter, is thus to be achieved in this regard. In the concrete case of the analog-to-digital converter, this means that a 5V input signal, for example, can be applied via a voltage divider as a matching arrangement to a 3V analog-to-digital converter or to the corresponding input of a computer and converted without any loss of accuracy.

This object is achieved by a method and a device for detecting at least one first signal for a computer, the first signal being converted to a second signal by a converter device. In an advantageous manner, a first reference signal is applied to a reference device which converts it to a second reference signal, the second reference signal being switched to a converter device which converts it to a third reference signal, the second reference signal also being switched to a matching arrangement which matches the second reference signal to a fourth reference signal, the fourth reference signal also being switched to the converter device which converts it to a fifth reference signal, a correcting quantity being determined from a comparison of the third reference signal and the fifth reference signal in the computer, and the first signal being detected as a function of this correcting quantity.

In an expedient embodiment, the first signal is detected as a function of the correcting quantity in such a way that the first signal is converted to the second signal as a function of the correcting quantity, and the first signal is detected by analyzing the second signal, so that the correcting quantity determined has an influence on the conversion itself.

A next expedient embodiment is characterized in that the first signal is detected as a function of the correcting quantity in such a way that the first signal is converted to the second signal, and the second signal is matched to a third signal as a function of the correcting quantity, the first signal then being detected by analyzing the third signal, so the second signal converted from the first signal is linked to or influenced by the correcting quantity.

In this way, a computer having a first voltage, e.g., 3V, can convert signals having a different voltage, in particular a higher voltage, e.g., 5V, by using a normal matching arrangement, such as an internal or external voltage divider with a greatly improved accuracy, in particular in the case of an input signal having a voltage higher than the voltage at which the computer operates.

This makes it possible to eliminate process costs in the computer for a special converter device, usually an additional device, in particular an analog-to-digital converter, having a voltage different from the computer voltage. On the other hand, only low additional costs are incurred by integrating or attaching the device according to the present invention or the elements and connections thereof which are not yet included.

The correcting quantity can be determined repeatedly to advantage at preselectable intervals, which may be the same or different, and/or as a function of times of certain events, e.g., clocked signal acquisition. This method can thus also be used repeatedly in the operation of the computer in an advantageous manner to compensate for temperature-dependent changes or leakage currents, for example. This also makes it possible to eliminate changes in the matching arrangement due to aging, so a loss of accuracy in this regard can at least be compensated, and in general a definite increase in accuracy can even be achieved, because even internal inaccuracies, including those not due exclusively to the matching arrangement, can be compensated according to the present invention.

In addition, it is also advantageous that the first reference signal can be preselected to be variable so that the third reference signal, which is converted by the converter device, and the first reference signal correspond within preselectable tolerances, in particular they are identical at a desired tolerance of 0. In the case of a digital-to-analog converter as a reference device, this means in concrete terms that the voltage can be applied with a very high accuracy, because voltage is read back over the same circuit or an identically dimensioned circuit, and thus the voltage, which has undergone a digital-to-analog conversion, can be corrected. This control mechanism makes it possible to use matching arrangements which have a lower accuracy and are therefore less expensive.

DETAILED DESCRIPTION

Figure 1:
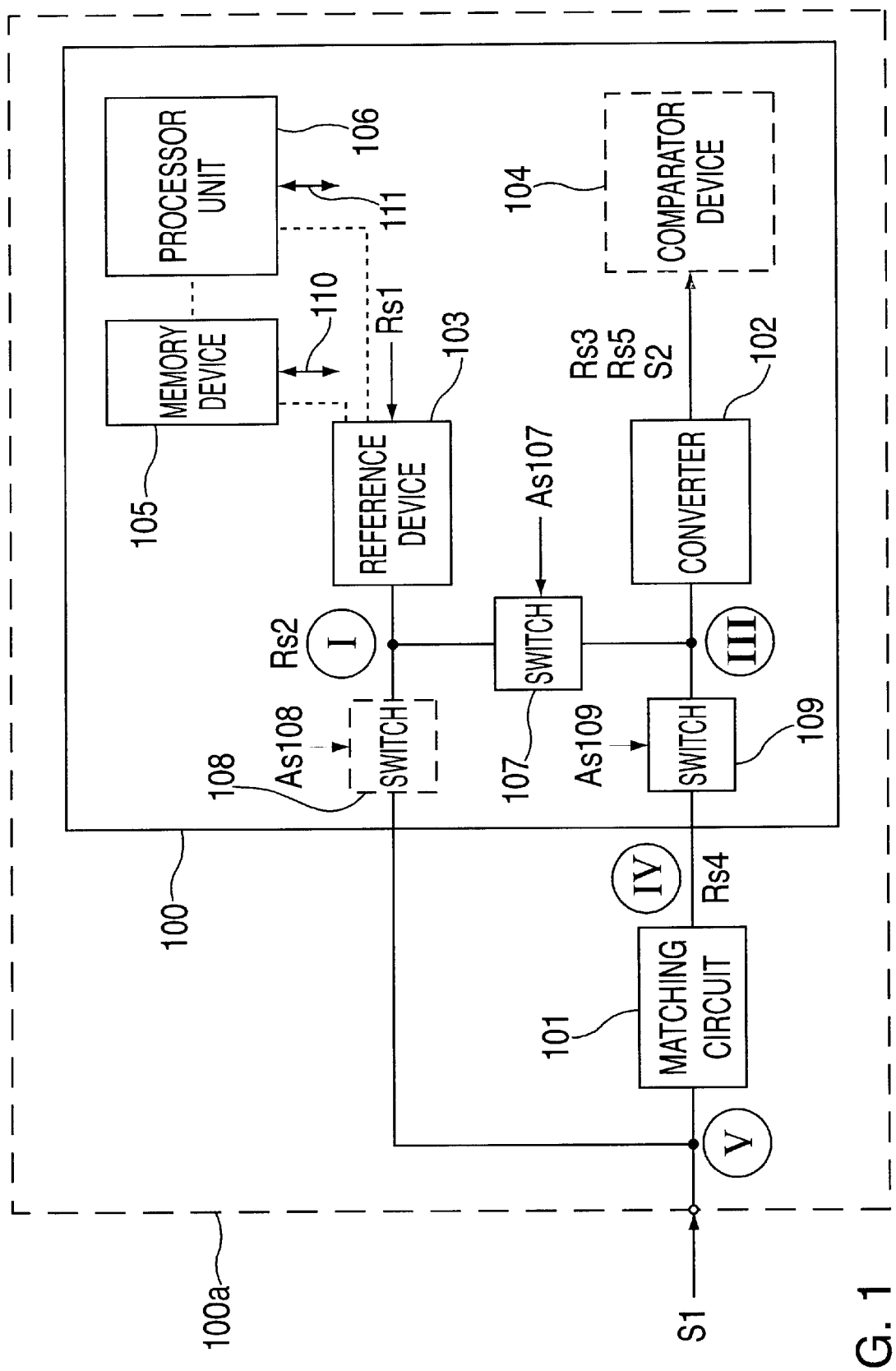
FIG. 1 shows a schematic diagram of an arrangement according to the present invention in or with a computer.

FIG. 1 shows a computer 100 which is used to control operating sequences in a motor vehicle, for example, having a computer unit or a processor unit 106 and a memory 105 assigned to it. For reasons of simplicity, the input/output signal paths are represented symbolically with double arrows 110 and 111. 101 indicates a matching arrangement for matching an applied signal S1 and the properties of the signals processed in computer 100. A reference signal Rs1 is applied to a reference device 103 which makes it available as a converted signal (Rs2) at point I. Reference signal Rs1 can be preselected and can in particular be generated automatically, e.g., by processor unit 106. A first switching element 107 switches the converted first reference signal, i.e., reference signal Rs2, through from point I to point III. The signal is switched through by applying a control signal As107.

Then the signal is applied to converter device 102 at point III and can be converted by it. This converted signal Rs3 can then be stored in a memory device, e.g., 105, or another memory device provided specifically for this purpose. At the same time, signal Rs2, which is converted reference signal Rs1, is applied to matching arrangement 101 at point V, is matched there and appears as reference signal Rs4 at point IV. Another switching element 108 may optionally be provided to actively switch reference signal Rs2 through from point I to point V, which can be accomplished by applying a control signal As108.

Reference signal Rs4 is then switched through from point IV to point III using switching element 109, which can be accomplished by applying a control signal As109. This reference signal Rs4, which is sent over matching circuit 101, is then also converted (Rs5) in converter device 102 and stored in a memory, in particular memory 105 or a memory provided specifically for this purpose, or it may also be compared immediately with previous reference signal Rs3.

This comparison can be performed either by a processor unit or computer unit 106 or optionally by a comparator device 104 which is provided specifically for this purpose. There is preferably no additional input signal S1 during referencing, i.e., switching through and processing of the reference signals.

Thus, the principle according to the present invention is to supply an accurate signal at point I, and to measure or detect this signal by converter device 102, the accurate signal being passed through matching arrangement 101 at point I. A comparison of the two converted signals (Rs3 and Rs5) then makes it possible to determine a correction factor which compensates for temperature effects, aging phenomena and other influencing parameters, based on the accuracy of the conversion.

The matching arrangement and the leads to it can be secured and connected outside of computer 100 or they may be integrated into it, which is indicated as optional by the diagram of computer 100a.

Switching elements that can be used include transistors, controlled switches and the like. Likewise, a comparator arrangement, in particular with comparison of threshold values or a voltage divider circuit and the like may also be used as the matching arrangement. The reference device may be a converter, e.g., a frequency-to-voltage converter or a digital-to-analog (D/A) converter, a signal generator or the like. Various embodiments are also conceivable for the converter device, such as an A/D converter, a voltage-to-frequency converter and the like.

Figure 2:
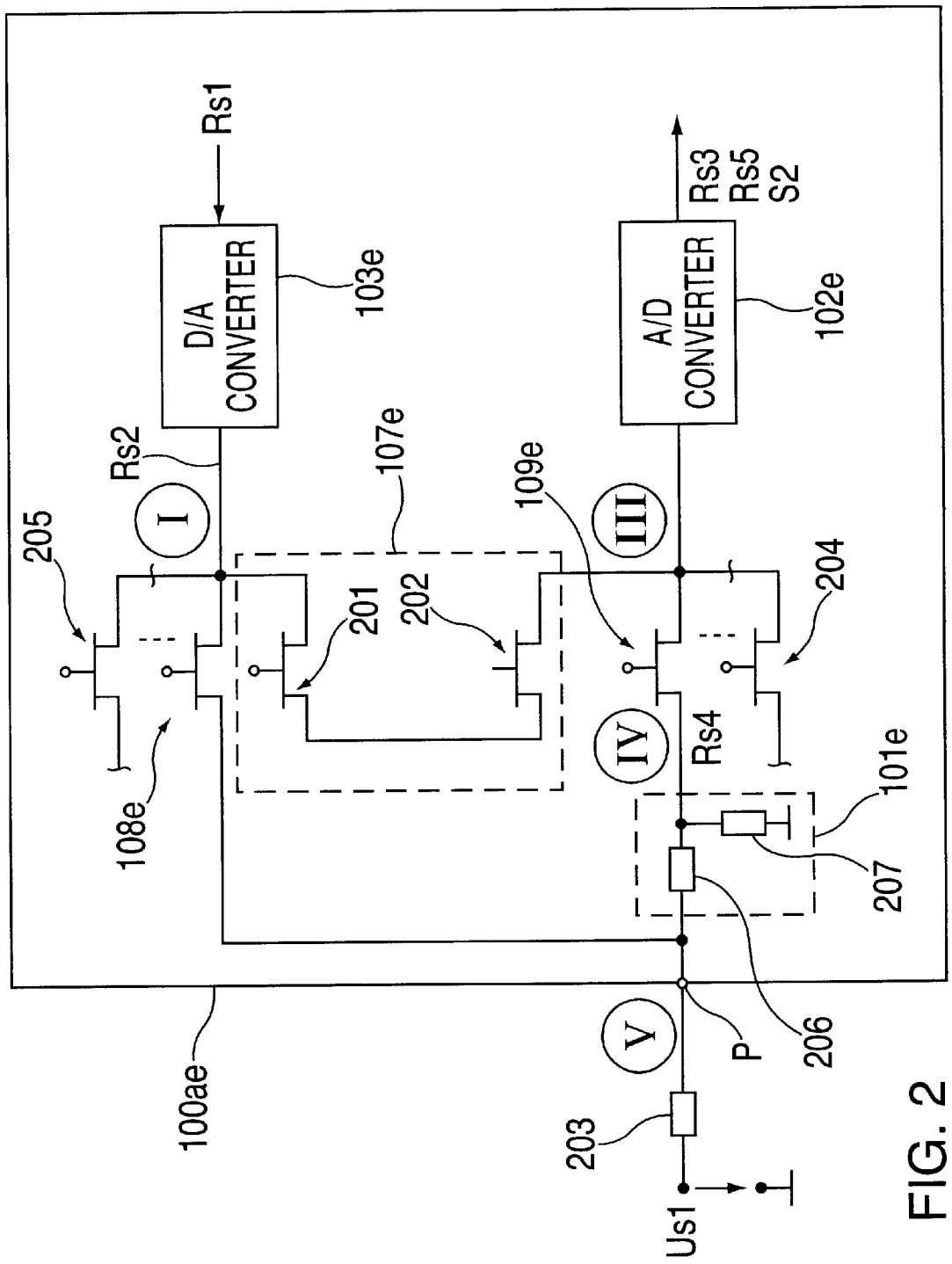
FIG. 2 shows a special embodiment having an analog-to-digital converter, a digital-to-analog converter, transistors as switching elements and a voltage divider.

FIG. 2 shows a concrete embodiment of the device according to the present invention, using an analog-to-digital converter 102e as the converter device and a digital-to-analog converter 103e as the reference device.

As already mentioned in the introduction, an analog/digital input multiplexer, indicated here by transistors 202, 109e and 204, is used in computer 100ae when multiple signal channels are used. To minimize the error in the transistors, they may be selected to be the same, in which case 201, 108e and 205 on the one hand and 202, 109e and 204 on the other hand may each be designed differently as a group.

The numbering in FIG. 2 is selected so that elements which are specified more precisely for this specific embodiment in comparison with FIG. 1 are indicated by an additional "e" for "example," i.e., converter device 102 and reference device 103 from FIG. 1 are represented by an A/D converter 102e and a D/A converter 103e in this specific embodiment.

According to the number of channels, an input pin P is needed for each channel, so that a transistor arrangement consisting of transistors 201, 108e and 205 is shown accordingly.

The matching arrangement, shown here as voltage divider 101e composed of resistors 206 and 207, is integrated into computer 100ae in the embodiment in FIG. 2, but it can also be located outside the computer, as illustrated in FIG. 1, and only connected to it according to the present invention.

Other transistors in accordance with the use of multiple channels are indicated as 204 and 205. Transistors 201 and 202 are preferably used as switching element 107e and are controlled accordingly for switching through from point I to point III. Switching element 109 corresponds to transistor 109e and switching element 108 corresponds to transistor 108e. The control signals illustrated in FIG. 1 switch over the control pins of the transistors.

Two resistors 206 and 207 of matching arrangement 101e have an accuracy of 1%, for example. This is usually at least one power of ten greater than the accuracy of a conventional analog-to-digital converter, which is in the order of 0.1%. This loss of accuracy can be compensated according to the present invention. Here in FIG. 2, signal S1 corresponds to a voltage Us1 which is applied upstream from resistor 203 and is supplied to the computer through the pin at point V. This voltage Us1 or signal S1 is then converted to signal S2 by the converter device, in particular A/D converter 102e, with previous referencing of the device according to the present invention, and is thus detected. When using multiple channels, the analog/digital input multiplexer composed of transistors 202, 109e and 204 is controlled by multiplexer software. This multiplexer software can also be used to control transistors 201, 108e and 205 in accordance with the number of channels.

Figure 3:
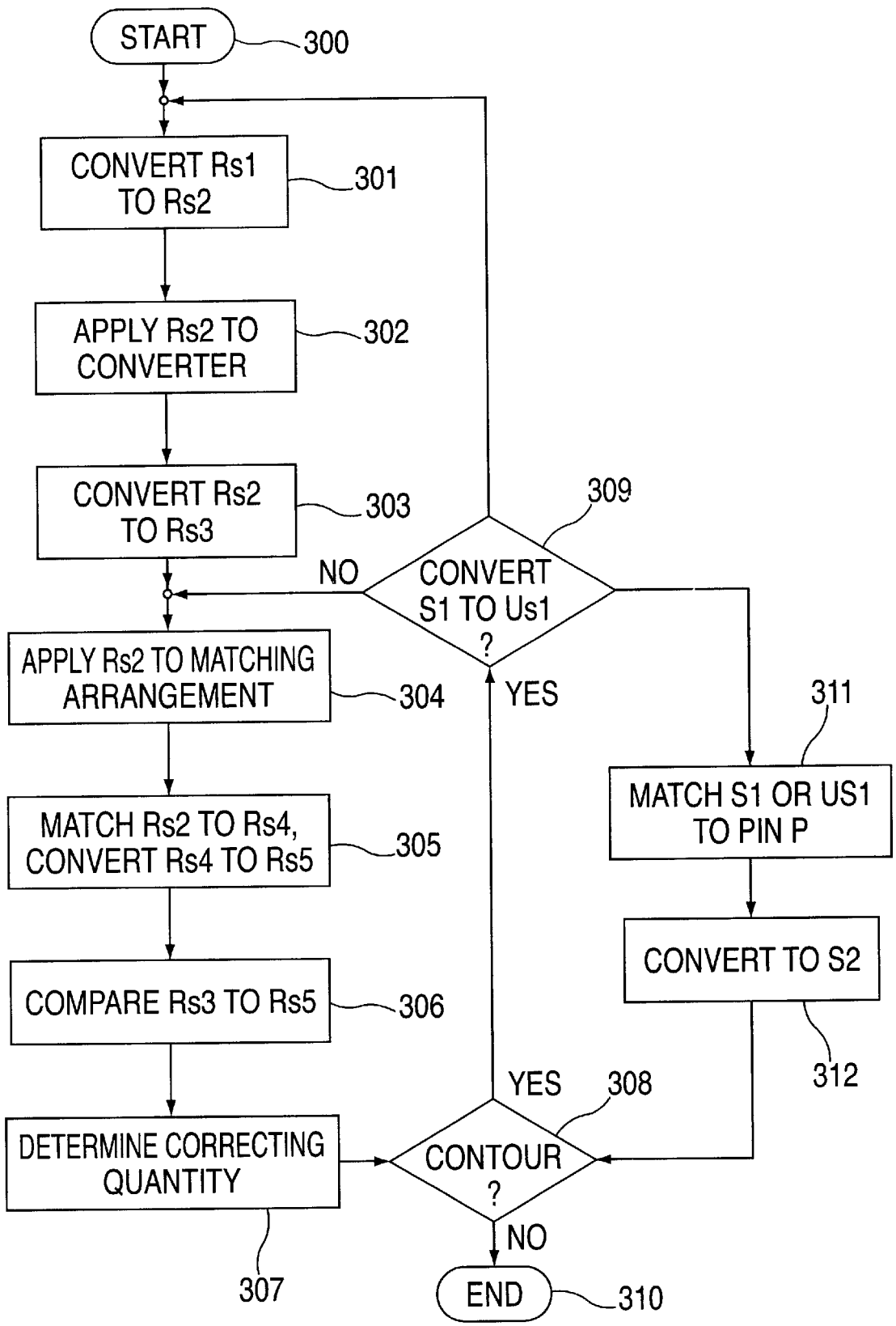
FIG. 3 shows a flow chart of the method according to the present invention.

The concrete control sequence and operating sequence are explained again with reference to a flow chart in FIG. 3.

The method starts in block 300. In block 301, a reference signal Rs1 is supplied to reference device 103 which converts it to a reference signal Rs2 at point I. Based on the concrete embodiment in FIG. 2, this means that from a preselectable digital reference signal, in particular a signal selected by processor unit 106, an analog voltage is set as reference signal Rs2 by digital-to-analog converter 103e at point I.

This reference signal Rs2 is subsequently switched through to point III in block 302, which is accomplished by switching element 107 and control signal As107. Based on the concrete embodiment, this means that transistors 201 and 202 are switched through or become conducting by a control signal at the control pin, i.e., switching element 107e is switched through, so the set voltage, as reference signal Rs2 at point III, is applied to the converter device, i.e., specifically analog-to-digital converter 102e here.

Then in block 303, reference signal Rs2 applied at point III is converted to a reference signal Rs3 by converter device 102. In particular, this reference signal Rs1 is stored in a memory, e.g., memory 105, which is provided for this purpose. Based on FIG. 2, this means again that the set voltage, as reference signal Rs2 at point III, is converted back by analog-to-digital converter 102e to a digital quantity as reference signal Rs3 and is stored in this form. This signal holding or signal storage of Rs3 is continued until Rs5 is available for comparison; this may also be accomplished by other volatile storage media.

Then in block 304, reference signal Rs2 is sent to matching arrangement 101. This can be accomplished in a controlled manner, for example, by using switching element 108 and control signal As108. Also based on FIG. 2, this means that transistor 108e switches through the set voltage as reference signal Rs2 at point I to point V upstream from matching arrangement 101e, here a voltage divider having resistors 206 and 207.

In block 305 which follows, reference signal Rs2 is then converted or matched to reference signal Rs4 at point IV by the matching device or the matching arrangement and is also switched through by switching element 109 and control signal As109 at point III, applied reference signal Rs4 then being converted to a reference signal Rs5 by converter device 102.

Based on FIG. 2, this means in turn that reference signal Rs2, which is switched through to point V, is converted to reference signal Rs4 at point IV by voltage divider 101e. Then transistor 109e, determined by an actuation at its control pin, switches this signal Rs4, i.e., the voltage applied there, through to point III, where it is converted to a digital signal Rs5 by analog-to-digital converter 102e.

Then in block 306, there is a comparison of the two reference signals Rs3 and Rs5 which are generated. This can be accomplished by forming the difference, by threshold comparison, by forming a ratio, etc. In a special embodiment, the difference between reference signals Rs3 and Rs5 is formed here. This comparison results in a correcting quantity which is used in the remaining process and reflects the prevailing situation, based on the accuracy or inaccuracy with respect to the effect of temperature, inaccuracies in the matching arrangement, etc.

Then in block 307, the correcting quantity thus determined is stored. This can then be used as a correction factor, a correction addend, etc., depending on the desired compensation or determination of the correcting quantity.

Inquiry 308 determines whether the method is to be continued further or whether it is terminated. This means whether referencing is to be continued as described or whether or not a signal S1 or voltage Us1 applied at the input is converted. Termination at this point can be carried out, for example, by a preselectable termination condition, so that the method then branches off to the end of the method in block 310.

If the method is continued, it goes to inquiry 309, where an inquiry is made as to whether referencing is to take place as described above, or whether with the help of the correcting quantity thus determined, an applied signal S1 or Us1 is to be converted. If this is the case, it leads to block 310; otherwise, referencing is run through again after block 301. The conditions may be preselected (even in block 308) or used as a time condition (clock cycle) or as an event-controlled basis.

In block 311, applied voltage Us1 or applied signal S1 is matched to pin P by the matching arrangement and switched through to point III, either by switching element 109 with control signal As109 or the voltage with transistor 109e.

In block 312 which follows, the signal or voltage applied at point III is converted by converter device 102, in particular analog-to-digital converter 102e, to signal S2, in particular a digital signal.

The conversion can then take place in such a way that the converter device converts the signal applied at point III to signal S2, taking into account the correcting quantity, so that the inaccuracies are already compensated in the conversion or the signal conversion. Secondly, a conversion of the signal at point III can take place easily, and then the correcting quantity is linked as a factor or as an addend to resulting signal S2 to yield a signal S3, which then represents signal S1, so that signal S1 is detected, and which is then present with compensated inaccuracies. This can be accomplished, for example, by processing unit 106 or optionally also by a special comparator device 104 with regard to the referencing.

The method shown here or the individual steps can also be represented in the software, e.g., as a computer program having a program code arrangement. Then the individual steps are carried out with sequence control or time control based on a control program or a computer program, which can then be stored as a computer program product having a program code arrangement on any desired computer-readable data medium (CD-ROM, EEPROM, flash memory, RAM, disk, etc.).

In the case of a special embodiment, a 3V or 3.3V A/D converter receives a 5V input signal with the help of a voltage divider. Based on this embodiment, computers lower than 3.3V or the corresponding A/D converters can in principle also be operated by this method. In other words, the same resolution can be achieved or the accuracy can be maintained or improved even with a lower voltage. Thus, the advantages mentioned above and the other advantages deriving from the description can also be achieved.

What is claimed is:

1. A method of detecting at least one first signal for a computer, comprising the steps of:
    converting the at least first signal to a second signal;
    applying a first reference signal to a reference device that converts the first reference signal to a second reference signal;
    switching the second reference signal to a converter device that converts the second reference signal to a third reference signal;
    switching the second reference signal to a matching arrangement that matches the second reference signal to a fourth reference signal;
    switching the fourth reference signal to the converter device, the converter device converting the fourth reference signal to a fifth reference signal;
    determining a correcting quantity from a comparison of the third reference signal and the fifth reference signal in the computer; and
    detecting the at least first signal as a function of the correcting quantity.

2. The method according to claim 1, further comprising the steps of:
    detecting the at least first signal as a function of the correcting quantity in such a way that the at least first signal is converted to the second signal as a function of the correcting quantity; and
    detecting the at least first signal by analyzing the second signal.

3. The method according to claim 1, further comprising the steps of:
    detecting the at least first signal as a function of the correcting quantity in such a way that the at least first signal is converted to the second signal;
    matching the second signal to a third signal as a function of the correcting quantity; and
    detecting the at least first signal by analyzing the third signal.

4. The method according to claim 1, wherein:
    the at least first signal has a maximum level that is higher than a maximum level of the second reference signal.

5. The method according to claim 1, further comprising at least one of the steps of:
    determining the correcting quantity repeatedly at preselectable intervals that are one of the same and different; and
    determining the correcting quantity as a function of a time of an event.

6. The method according to claim 5, wherein:
    the event corresponds to a signal acquisition.

7. The method according to claim 1, further comprising the step of:
    preselecting the first reference signal to be variable so that the third reference signal, which is converted by the converter device, and the first reference signal correspond within a preselectable tolerance.

8. The method according to claim 1, further comprising the step of:
    preselecting the first reference signal to be variable so that the third reference signal, which is converted by the converter device, and the first reference signal are identical.

9. The method according to claim 1, wherein:
    the at least first signal, the second reference signal, and the fourth reference signal are signals of a first type,
    the first reference signal, the third reference signal, and the fifth reference signal are signals of a second type, and
    the signals of the first type and the signals of the second type are differentiated.

10. The method according to claim 9, wherein:
    the signals of the first type correspond to continuous signals, and
    the signals of the second type correspond to discrete signals.

11. The method according to claim 9, wherein:
    the signals of the first type correspond to analog signals, and
    the signals of the second type correspond to digital signals.

12. A device for detecting at least one first signal for a computer, comprising:
    a converter device for converting the at least first signal to a second signal;
    a reference device to which a first reference signal is applied and for converting the first reference signal to a second reference signal;
    a first switching element for switching the second reference signal to the converter device, the converter device converting the second reference signal to a third reference signal;
    a matching arrangement for receiving the second reference signal and matching the second reference signal to a fourth reference signal;
    at least a second switching element for switching the fourth reference signal to the converter device, the converter device converting the fourth reference signal to a fifth reference signal; and
    a comparator device for forming a correcting quantity from the third reference signal and the fifth reference signal, wherein:
    the at least first signal is detected as a function of the correcting quantity.

13. The device according to claim 12, further comprising:
    a third switching element for switching the second reference signal to the matching arrangement.

14. The device according to claim 12, wherein:
    the converter device includes an analog-to-digital converter,
    the reference device includes a digital-to-analog converter, and
    the matching arrangement includes a voltage divider circuit.

15. A computer, comprising:
    a device for detecting at least one first signal for a computer, the device including:
        a converter device for converting the at least first signal to a second signal,
        a reference device to which a first reference signal is applied and for converting the first reference signal to a second reference signal,
        a first switching element for switching the second reference signal to the converter device, the converter device converting the second reference signal to a third reference signal,
        a matching arrangement for receiving the second reference signal and matching the second reference signal to a fourth reference signal, at least a second switching element for switching the fourth reference signal to the converter device, the converter device converting the fourth reference signal to a fifth reference signal, and a comparator device for forming a correcting quantity from the third reference signal and the fifth reference signal, wherein:

the at least first signal is detected as a function of the correcting quantity.

16. A storage medium for storing a computer program that when executed causes a computer to perform the steps of:

converting at least one first signal to a second signal;

applying a first reference signal to a reference device that converts the first reference signal to a second reference signal;

switching the second reference signal to a converter device that converts the second reference signal to a third reference signal;

switching the second reference signal to a matching arrangement that matches the second reference signal to a fourth reference signal;

switching the fourth reference signal to the converter device, the converter device converting the fourth reference signal to a fifth reference signal;

determining a correcting quantity from a comparison of the third reference signal and the fifth reference signal in the computer; and detecting the at least first signal as a function of the correcting quantity.

17. The storage medium according to claim 16, wherein the computer includes:

a converter device for converting the at least first signal to the second signal, a reference device to which the first reference signal is applied and for converting the first reference signal to the second reference signal, a first switching element for switching the second reference signal to the converter device, the converter device converting the second reference signal to the third reference signal, a matching arrangement for receiving the second reference signal and matching the second reference signal to the fourth reference signal, at least a second switching element for switching the fourth reference signal to the converter device, the converter device converting the fourth reference signal to the fifth reference signal, and a comparator device for forming a correcting quantity from the third reference signal and the fifth reference signal, wherein:

the at least first signal is detected as a function of the correcting quantity.

* * * * *